(12) United States Patent
Bahary et al.

(10) Patent No.: US 9,467,252 B2
(45) Date of Patent: Oct. 11, 2016

(54) TURBO DECODERS WITH EXTRINSIC ADDRESSING AND ASSOCIATED METHODS

(71) Applicant: Freescale Semiconductor, Inc., Austin, TX (US)

(72) Inventors: Robert Bahary, Arlington Heights, IL (US); Eric J Jackowski, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 17 days.

(21) Appl. No.: 14/555,373

(22) Filed: Nov. 26, 2014

(65) Prior Publication Data

US 2016/0149668 A1     May 26, 2016

(51) Int. Cl.
*H03M 13/29* (2006.01)
*H04L 1/00* (2006.01)

(52) U.S. Cl.
CPC ........ *H04L 1/0071* (2013.01); *H03M 13/2957* (2013.01)

(58) Field of Classification Search
CPC .............................................. H03M 13/2957
USPC .......... 714/755, 762, 763, 792, 807
See application file for complete search history.

(56) References Cited

U.S. PATENT DOCUMENTS

| 6,392,572 | B1 | 5/2002 | Shiu et al. |
| 2005/0020426 | A1 | 1/2005 | Gardner et al. |
| 2007/0153731 | A1* | 7/2007 | Fine .................... H04L 25/0204 370/329 |
| 2008/0256417 | A1* | 10/2008 | Andersson ............ H03M 13/15 714/762 |
| 2012/0063533 | A1* | 3/2012 | Fonseka ................ H04L 1/0051 375/295 |
| 2012/0066566 | A1* | 3/2012 | Cui ................... H03M 13/2707 714/763 |

FOREIGN PATENT DOCUMENTS

| EP | 1401108 A1 | 3/2004 |
| WO | WO02/093755 A1 | 11/2002 |

OTHER PUBLICATIONS

Perttu Salmela, Ruirui Gu, Shuvra S. Bhattacharyya, and Jarmo Takala, Efficient Parallel Memory Organization for Turbo Decoders, Proceedings of the European Signal Processing Conference, pp. 831-835, Poznan, Poland, Sep. 2007.
3GPP standard 25.212, Universal Mobile Telecommunications System (UMTS), Multiplexing and channel coding (FDD), Technical Specification Group, Radio Access Network, version 10.1.0 Release 10, pp. 1-116, Dec. 2010.

* cited by examiner

*Primary Examiner* — Fritz Alphonse (57) ABSTRACT

A plurality of turbo decoder engines store extrinsic values when concurrently decoding a received signal encoded within rows and columns of an interleaving matrix where interleaved values stay in a same re-ordered row during interleaving. An extrinsic reader and extrinsic writer accesses extrinsic memories using extrinsic addresses. A deinterleaver accesses the extrinsic addressable memories by arranging storage of the extrinsic values by the same rows of the same interleaving matrix that was used to encode the received signal, each of the rows corresponding to one of the plurality of turbo decoder engines, and, in embodiments, can group the extrinsic values such that all the extrinsic values in each one of the rows of the interleaving matrix go in a same one of the plurality of the extrinsic addressable memory. The deinterleaver can skip read of extrinsic values corresponding to dummy entries in the interleaving matrix.

20 Claims, 9 Drawing Sheets

Interleaving Process

|    | 0 | 1 | 2 | . . . | 255 |
|----|---|---|---|-------|-----|
| 0  | 0 | 1 ▶ | 2 | . . . | 255 |
| 1  | 256 | 257 | 258 | . . . | 511 |
| 2  | 512 | 513 | 514 | . . . | 767 |
| 3  | 768 | 769 | 770 | . . . | 1024 |
| .  |   |   |   |       |     |
| .  |   |   |   |       |     |
| 19 | 4864 | 4865 | 4866 | . . . | 5119 |

LINEAR MATRIX 20X256
410

|    | 0 | 1 | 2 | . . . | 255 |
|----|---|---|---|-------|-----|
| 0  | 4865 | 4866 | 5119 | . . . | 4864 |
| 1  | 0 | 255 | 2 | . . . | 1 |
| 2  | 1236 | 1278 | 1042 | . . . | 1114 |
| 3  | 2787 | 2648 | 2623 | . . . | 2297 |
| .  |   |   |   |       |     |
| .  |   |   |   |       |     |
| 19 | 511 | 257 | 258 | . . . | 256 |

INTERLEAVED MATRIX 20X256
420

De-Interleaver Extrinsic RAM Access Pattern For 2 Engines

| | Engine 0 | | | Engine 1 | | |
|---|---|---|---|---|---|---|
| | | | Linear MAP | | | |
| Cycle | Row $RN_0$ | Column $RA_0$ | Extrinsic $REX_0$ | Row $RN_1$ | Column $RA_1$ | Extrinsic $REX_1$ |
| 1 | 0 | 0 | $E_0$ | 1 | 0 | $E_{256}$ |
| 2 | 0 | 1 | $E_1$ | 1 | 1 | $E_{257}$ |
| 3 | 0 | 2 | $E_2$ | 1 | 2 | $E_{258}$ |
| ... | | | | | | |
| 255 | 0 | 254 | $E_{254}$ | 1 | 254 | $E_{510}$ |
| 256 | 0 | 255 | $E_{255}$ | 1 | 255 | $E_{511}$ |
| 257 | 2 | 0 | $E_{512}$ | 3 | 0 | $E_{768}$ |
| 258 | 2 | 1 | $E_{513}$ | 3 | 1 | $E_{769}$ |
| ... | | | | | | |

↑ Skip over sub block done by other engine

FIG. 6

De-Interleaver Extrinsic RAM Access Pattern For 2 Engines

| | Interleaved MAP | | | | | | |
|---|---|---|---|---|---|---|---|
| | Engine 0 | | | | Engine 1 | | |
| | Row | Column | Extrinsic | | Row | Column | Extrinsic |
| Cycle | $RN_0$ | $RA_0$ | $REX_0$ | | $RN_1$ | $RA_1$ | $REX_1$ |
| 1 | 0 | 0 | $E_{4865}$ | | 1 | 1 | $E_{255}$ |
| 2 | 1 | 0 | $E_0$ | | 2 | 1 | $E_{1278}$ |
| 3 | 2 | 0 | $E_{1236}$ | | 3 | 1 | $E_{2648}$ |
| .... | | | | | | | |
| 20 | 19 | 0 | $E_{511}$ | | 0 | 2 | $E_{5119}$ |
| 21 | 0 | 1 | $E_{4866}$ | | 1 | 2 | $E_2$ |
| 22 | 2 | 2 | $E_{1042}$ | | 3 | 3 | $E_{2623}$ |
| 23 | 3 | 2 | $E_{2623}$ | | 4 | 3 | $E_{4122}$ |
| .... | | | | | | | |

↑ Skip over sub block done by other engine

TURBO DECODERS WITH EXTRINSIC ADDRESSING AND ASSOCIATED METHODS

BACKGROUND OF THE INVENTION

1. Technical Field

Embodiments of the present invention relate to turbo decoders and, more particularly, relate to avoiding memory conflict with a turbo decoder.

2. Description of the Related Art

Telecommunications involves sending information from a transmitter to a receiver. Channel coding is a process performed by the transmitter of adding extra information bits or redundant bits to the information to be sent. The receiver then uses the redundant bits to help it identify the sent message.

Typically signals are encoded before being sent to a cellular telephone using a method of encoding defined in a cellular standards specification. An encoder in the transmitter adds redundancy using a predetermined method and a decoder in the receiver uses knowledge of the redundancy method to increase reliability of data demodulation and decoding. Typically high latency sensitive traffic signals such as voice are encoded using a convolutional coder and lower latency sensitive traffic signals such as data are encoded using a turbo encoder. While cellular standards specifications specify the requirement for turbo encoding a signal, these cellular standards specifications do not typically specify the operations for turbo decoding a signal. Turbo decoding is basically defined as the reverse process of turbo encoding.

Turbo encoding is one method of encoding by adding redundancy. A turbo encoder uses an interleaver to shuffle the bits to be transmitted into a random order. The interleaving process increases the probability that errors introduced while the coded data is transmitted can be overcome and the original information reconstructed at the receiver.

A turbo decoder uses an iterative algorithm. For example, a turbo decoder may decode information using plural maximum a posteriori (MAP) estimates. The turbo decoder alternates between processing received samples relating to $(x_k, z_k)$ called even MAP estimates, and processing received samples relating to $z'_k$ called odd MAP estimates. The two MAP estimates are together called an iteration. For example, if the turbo decoder performs 4 iterations that means it would have processed 8 MAP estimates.

The turbo encoder and turbo decoder are an integral part of telecom standards with data rates reaching upwards of 100 Mbps (million bits per second). These high data rates create new demands on processing speed which require multiple bits to be processed in parallel. To achieve this, a parallel architecture of multiple decoder engines is used. There are two ways to decode in parallel. A first way is to break a coded block into smaller sub-blocks, and process those in parallel. A second way is to process multiple coded blocks in parallel. The first approach increases decoding latency and input random access memory (RAM) requirements. The second approach may have problems with memory conflicts.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

The details of the various embodiments will be more readily understood from the following detailed description when read in conjunction with the accompanying drawings wherein.

DETAILED DESCRIPTION OF THE EMBODIMENTS

Figure 1:
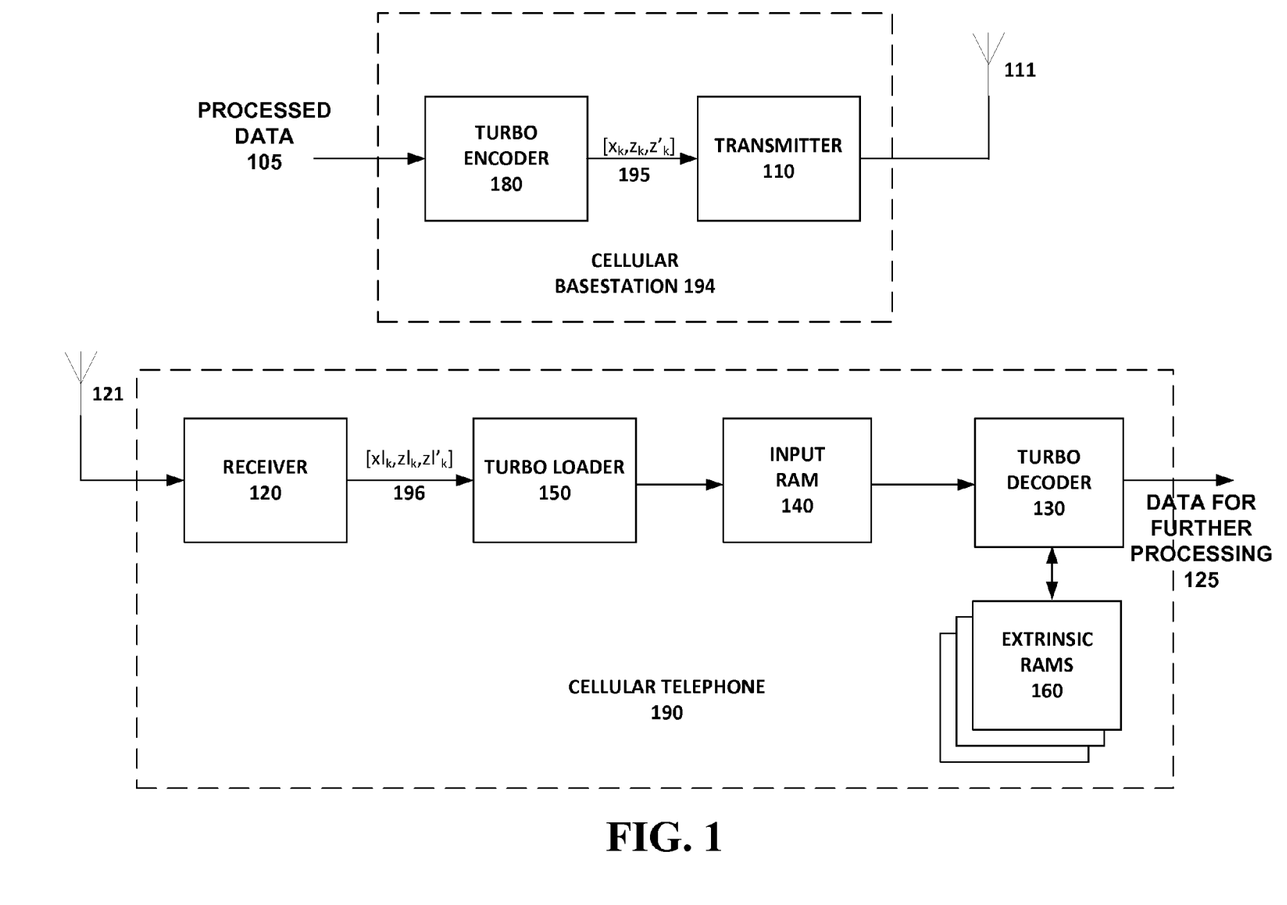
FIG. 1 illustrates a schematic block diagram of an exemplary cellular base station and an exemplary cellular telephone according to an exemplary embodiment of the present invention.

FIG. 1 illustrates a schematic block diagram of an exemplary cellular basestation 194 and an exemplary cellular telephone 190 according to an exemplary embodiment of the present invention. A turbo encoder 180 and transmitter 110 are in the cellular basestation 194 coupled to an associated antenna 111. The turbo encoder 180 sends encoded data $[x_k, z_k, z'_k]$ to the transmitter 110.

The cellular basestation 194 takes in voice or internet data and processes it. After some processing, the processed data 105 is sent to the turbo encoder 180. The turbo encoder 180 takes input bits $x_k$, and adds redundant information. A predetermined interleaving sequence is used to derive this redundant information. Both the encoder and the decoder are preprogrammed according to an agreed upon specification standard with the same predetermined interleaving sequence. This redundant information is labeled $z_k$ and $z'_k$, and shown in FIG. 2. The redundant information is added to the output of an encoder in order to help the decoder correct errors in the data $x_k$. The data and redundant information $[x_k, z_k, z'_k]$ go through the transmitter 110 and over the air to the receiver 120.

A radio receiver 120, a turbo loader 150, input RAM 140, a turbo decoder 130, and a plurality of extrinsic RAMs 160 are in the cellular telephone 190 coupled to an associated antenna 121. While a random access memory is one preferred embodiment for the input RAM 140 and the extrinsic RAMs 160, any extrinsic addressable memory can be used such as flash or latches or flip flops.

The radio receiver 120 and antenna 121 can be typical of that used in a portable cellular telephone 190 or other mobile cellular radio device. The receiver 120 demodulates a received signal and may descramble the signal depending on the cellular standards specification needed. Next the received signal is decoded. Depending on the type of signal received, a turbo loader 150 and a turbo decoder 130 are used to decode the demodulated received signal.

After transmission of the encoded data [$x_k$, $z_k$, $z'_k$] 195 by the transmitter 110 via the antenna 111, received encoded data [$x1_k$, $z1_k$, $z1'_k$] 196 is initially received by the receiver 120 and written into the input RAM 140 by the turbo loader 150. The turbo decoder 130 derives extrinsic values from the received encoded data signal. These extrinsic values are stored in the extrinsic RAMs 160 and made available during the iterations processed by the turbo decoder 130. These so-called iterations can place heavy demands on the random access memory RAM 160 and may be performed by multiple turbo decoder engines within the turbo decoder 130. During an iterative process the turbo decoder 130 improves the extrinsic values in the extrinsic RAMs, to arrive at a result for the transmitted bit. A conflict may occur if more than one decoder engine attempts to access the same extrinsic RAM 160 in the same cycle. Memory conflicts can lead to decoding data errors.

Figure 2:
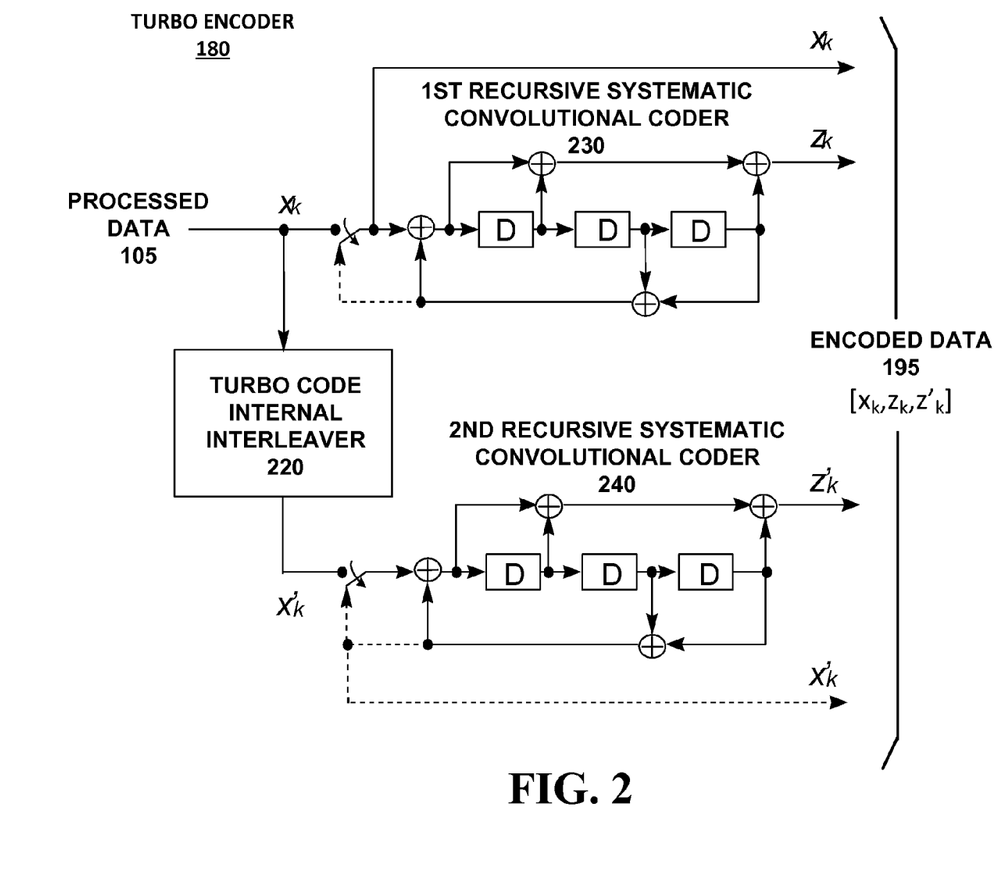
FIG. 2 illustrates a schematic block diagram of an exemplary turbo encoder relating to embodiments of the present invention.

FIG. 2 illustrates a schematic block diagram of an exemplary turbo encoder 180 relating to embodiments. The turbo encoder 180 encodes processed data 105. According to an embodiment, the turbo encoder uses two recursive systematic convolutional coders (RSC). In FIG. 2, two turbo encoder paths are illustrated, one path for a first recursive systematic convolutional coder (RSC) 230 and a second path for a second recursive systematic convolutional coder (RSC) 240, coupled to a turbo code interleaver 220. The interleaver 220 increases the probability that errors that cause a problem for one RSC, will not for the other. The interleaver 220 ensures this by spreading the data out in a defined manner. The interleaver 220 re-orders values within rows and columns of an interleaving matrix where interleaved values stay in a same re-ordered row. In embodiments of the present invention, rows can be defined as columns and columns defined as rows because the nature of a row or column is arbitrary. This may depend on the encoder for which as given decoder is designed.

Each of the first recursive systematic convolutional coder 230 and the second recursive systematic convolutional coder 240 have the illustrated series of three delays and four feedback and feed forward modulo 2 adders. The encoded data 195 output from the turbo encoder 180 includes $x_k$ (the input processed data 105), $z_k$ (result of the first recursive systematic convolutional coder 230, and $z'_k$ (result of the second recursive systematic convolutional coder 240). The encoded data 195 also may include $x'_k$ which is used at the end of a processed data block to ensure the encoder ends in an all zero state.

The turbo encoder 180 encodes the processed data 105 to generate encoded data [$x_k$, $z_k$, $z'_k$] 195. The turbo encoder 180 uses an interleaver 220 for interleaving the values of the processed data 105 (i.e., of the input sequence) within rows and columns of an interleaving matrix. In the interleaver 220, the values of each row form a group and the values in each group stay within a same group. The interleaver 220 also re-orders the groups among rows and re-orders the values within a group.

Figure 3:
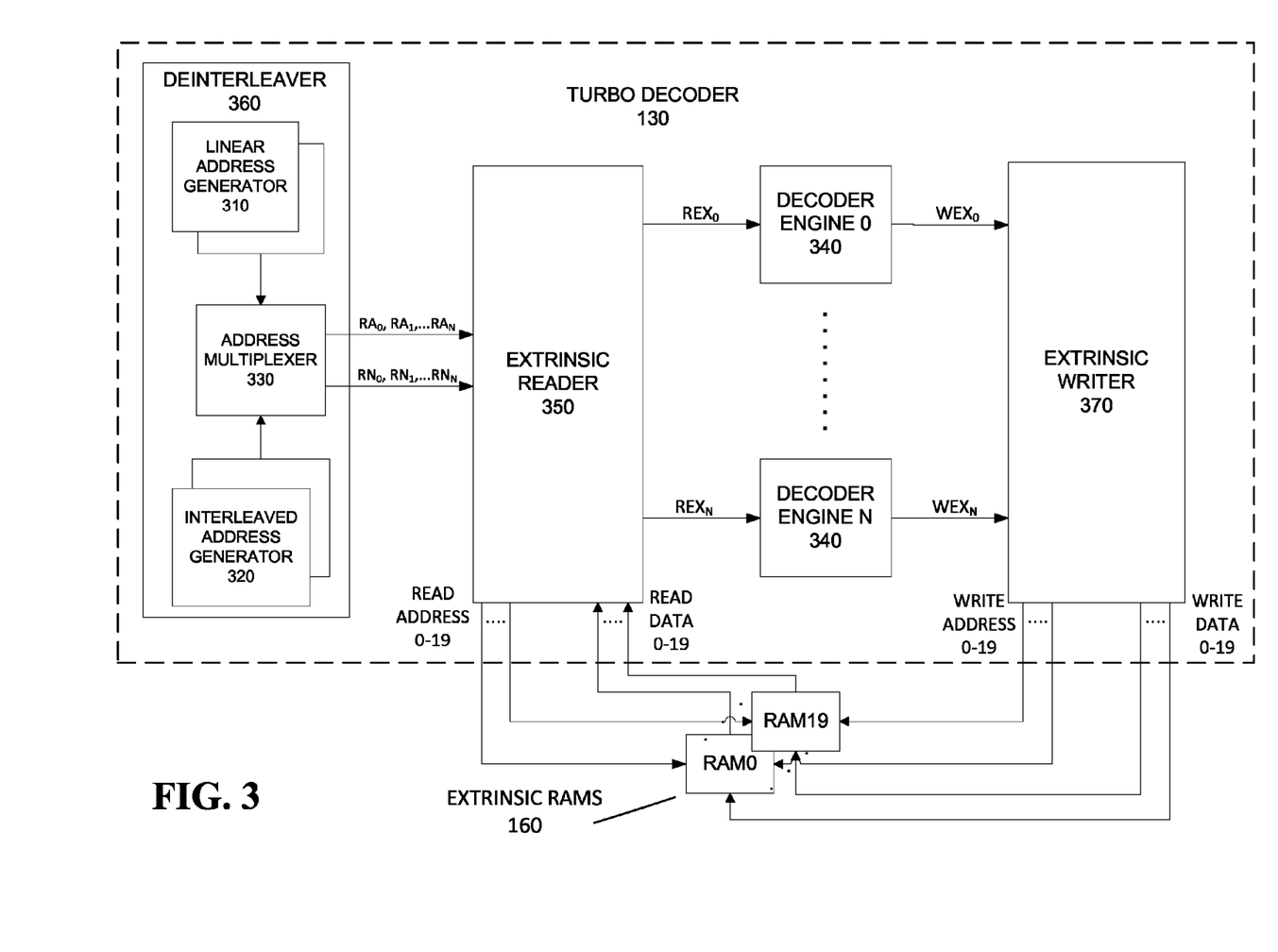
FIG. 3 illustrates a schematic block diagram of the turbo decoder and extrinsic RAMs according to an exemplary embodiment of the present invention.

FIG. 3 illustrates a schematic block diagram of the turbo decoder 130 and extrinsic RAMs 160 according to an exemplary embodiment of the present invention. During the decode process, the decoder 130 generates one extrinsic value for every bit of the processed data 105 that went into the encoder 180 originally. The turbo decoder 130 is responsible for reversing the interleaving process. To unwind the interleaving procedure, it may save power to generate the desired extrinsic values address in memory rather than move the data itself.

The turbo decoder 130 updates the extrinsic values each iteration. For each extrinsic value updated, one extrinsic value needs to be read and written. For high speed applications, a parallel architecture is used which may read and write multiple extrinsic values per cycle. The deinterleaver 360 may generate multiple addresses in parallel in order to read and write the extrinsic values. This may lead to memory conflicts if the correct memory architecture is not chosen. Memory conflicts can lead to decoding data errors. What is needed is a turbo decoder that avoids memory conflicts.

One problem addressed by the embodiments of the present invention is how to organize the extrinsic values in the extrinsic RAMs 160 without memory conflicts in these extrinsic RAMs 160 in a scalable parallel turbo decoder architecture without any loss of cycles or extra overhead. When extrinsic values are stored in the array of extrinsic RAMs 160, there is a possibility of conflict on either a read or a write operation. Read and write conflicts can occur when more than one turbo decoder engine acts on the same RAM at the same time. It is trivial to guarantee no conflicts occur during the linear MAP estimates, however, it is difficult to ensure no read or write conflicts for both a linear and interleaved MAP estimate.

Embodiments of the present invention avoid conflicts when accessing the extrinsic RAMs 160 by multiple turbo decoder engines. Embodiments of the present invention are applicable to avoiding memory conflicts in turbo decoders for the 3rd Generation Partnership Project (3GPP) cellular specification as defined in 25.212 Section 4.2.3.2.3. Extrinsic values are generated by the turbo decoder 130 for use in future MAP estimates. The location in extrinsic RAM 160 cannot be moved between linear and interleaved MAP estimates. That is, a RAM architecture for extrinsic RAMs 160 is used that allows linear and interleaved access from the decoder engines to go to unique extrinsic RAMs 160. The block of data to be decoded is broken up into sub-blocks. A sub-block of data is processed in parallel by decoder engines 340 acting on sub-blocks of the input data block. Each interleaved row is placed in a separate extrinsic RAM 160. The sub-block size is chosen to ensure that each decoder engine is taking data from a different interleaved row during both the linear and interleaved MAP estimates. This organization of data in memory prevents the aforesaid problem of memory conflicts.

The turbo decoder 130 reads extrinsic values from extrinsic RAMs 160, updates the extrinsic values so read, and then writes these updated extrinsic values back to the extrinsic RAMs 160. This is done in both linear and interleaved order. In addition, it is done in parallel with a concurrent operation of N+1 decoder engines 340. A conflict free address generator generates all extrinsic addresses and extrinsic rows per cycle.

The deinterleaver 360 generates the RAM Address ($RA_m$). This is the address in RAM 160 that the $m^{th}$ decoder engine uses. The deinterleaver 360 also generates a RAM Number ($RN_m$). The RAM Number ($RN_m$) specifies which RAM 160 the $m^{th}$ decoder engine uses data from. The extrinsic RAMs 160 are made up of 20 separate RAMs: RAM0 through RAM19 as illustrated in the embodiment of FIG. 3. These 20 extrinsic RAMs 160 are dual port RAMs, in an embodiment. There are also N+1 decoder engines 340 so m=[0, . . . , N] inclusive. During even MAP estimates the linear address generator 310 creates $RA_m$ and $RN_m$. During odd MAP estimates interleaved address generator 320 creates the $RA_m$, and $RN_m$. The address multiplexer 330 selects between the two sources. The extrinsic reader unit 350 maps the address to the requested extrinsic RAM 160, RAM0 through RAM19. For example, if the deinterleaver 360 sets $RN_3=5$, and $RA_3=23$, then the extrinsic reader unit 350 would start a read from RAM5 at address 23. The data received from the read would go to the third decoder engine 340, a.k.a. DECODER ENGINE 3. The extrinsic reader unit 350 sends the read extrinsic signal ($REX_3$) to the correct decoder engine 340. Extrinsic reader and writer units 350, 370 take all extrinsic addresses and extrinsic rows to generate one RAM address for each individual extrinsic RAM 160.

Each decoder engine then improves their extrinsic value and produces a write extrinsic signal ($WEX_k$). This write extrinsic signal $WEX_k$ goes to the extrinsic writer unit 370 and gets mapped back to its original read location $RN_k$ and $RA_k$. So the write extrinsic signal $WEX_k$ gets written to the same extrinsic RAM 160 at the same address it was read from.

Figure 4:
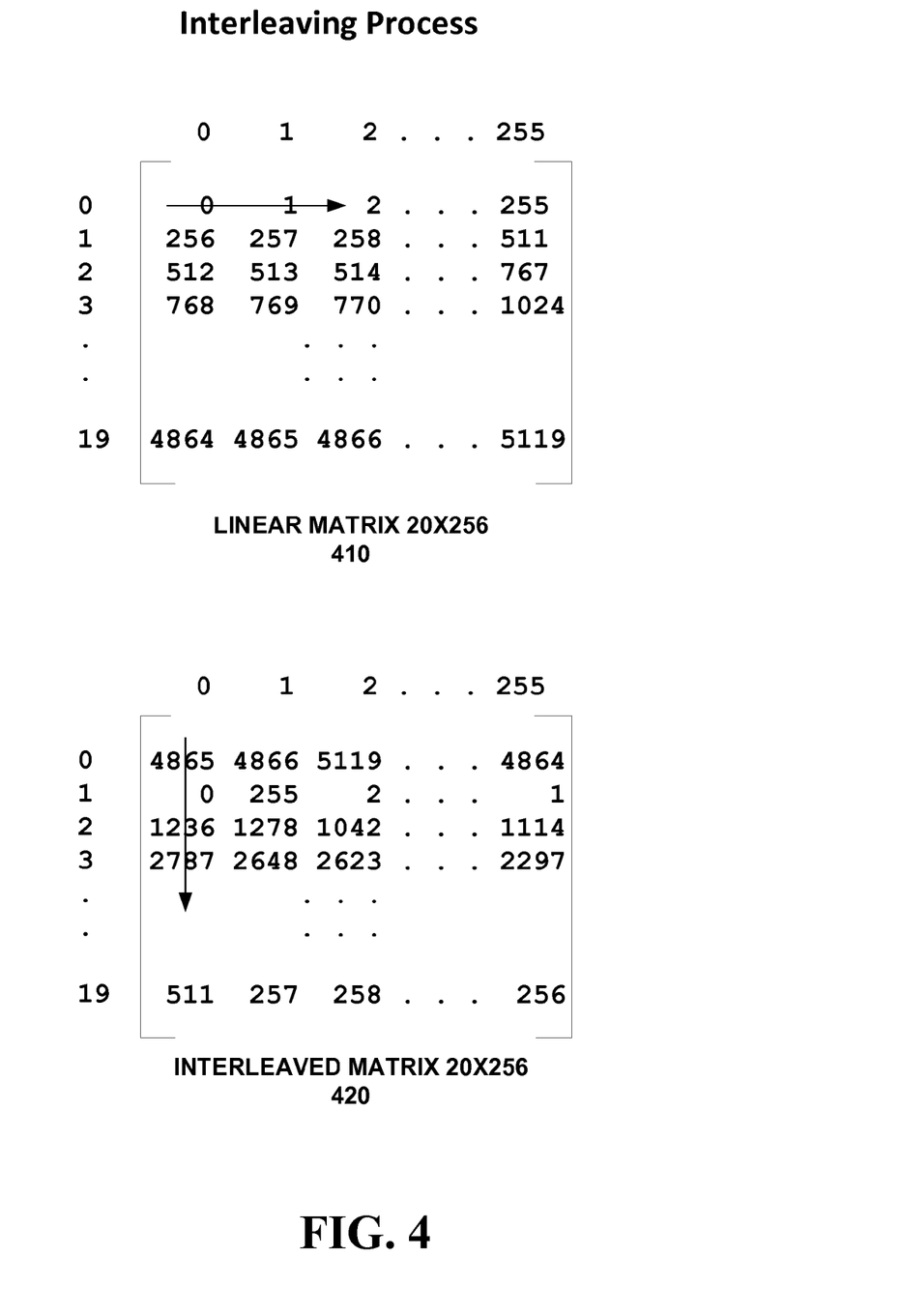
FIG. 4 illustrates example matrices of the interleaving process according to an exemplary embodiment of the present invention.

FIG. 4 illustrates example matrices of the interleaving process according to an exemplary embodiment of the present invention. A linear matrix 410 of 20×256 indices and an interleaved matrix 420 of 20×256 indices are illustrated. The numbers shown for the indices in the matrices of FIG. 4 are the bit indexes k used in the encoder from FIG. 2. The job of an interleaver, such as the interleaver in the 3GPP cellular standards, is to mix up the data as it is going to transmit. It mixes up the data by putting the processed data 105 into a matrix going across each row as shown by the right arrow in matrix 410. Then the rows are randomly interchanged. Also, the values within each row are re-ordered. Then the interleaved data is taken out going down each column as shown by the down arrow in matrix 420.

Instead of filling the interleaving matrix with the processed data 105, ascending bit indexes can be used (0, 1, 2, ..., 5119) as shown in matrix 410. Then after the interleaving procedure is applied by interchanging rows, and re-ordering values within each row, the interleaved matrix 420 is generated. The interleaved bit index can be obtained by reading the values going down each column from matrix 420. Indexing the processed data 105 with these interleaved bit indexes will create the data sequence generated by the interleaver 220, the same as if the processed data 105 was interleaved directly.

Figure 5:
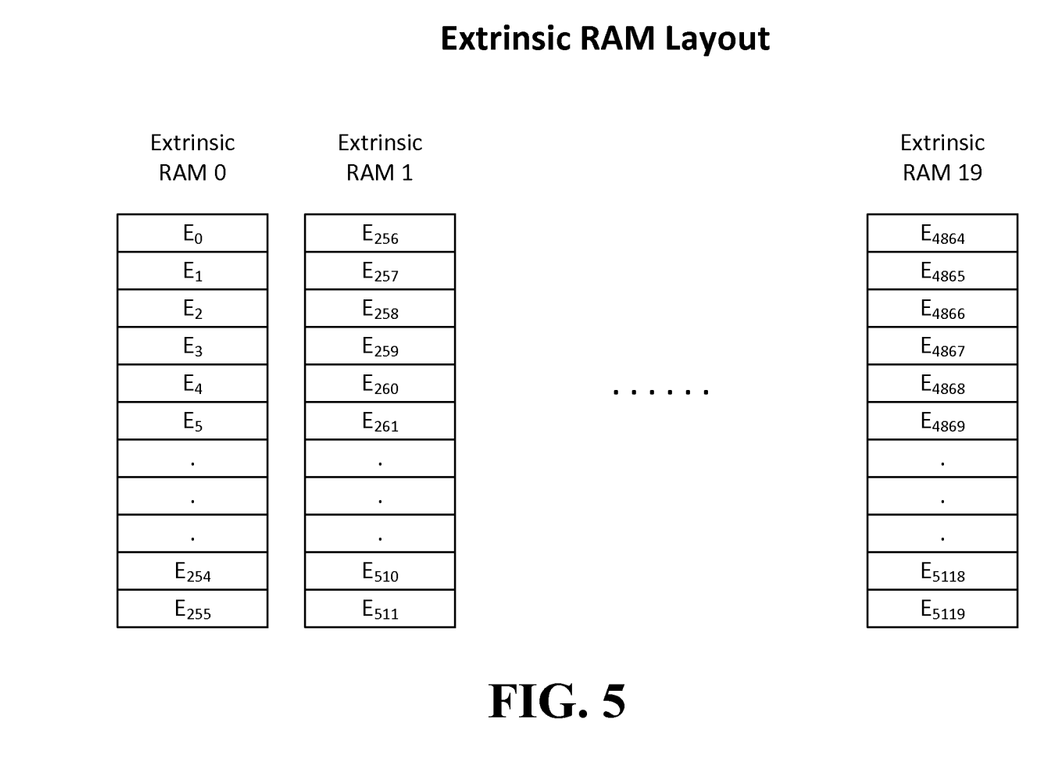
FIG. 5 illustrates the extrinsic RAM layout for a typical case.

FIG. 5 illustrates the extrinsic RAM layout for the example case shown in FIG. 4. All the values from the linear matrix 410 in FIG. 4 row 0, are in the first extrinsic RAM 0 (i.e., one of extrinsic RAMs 160). The values from the second row 1, are in extrinsic RAM 1 (i.e., another one of extrinsic RAMs 160). Using this mapping and carefully picking the spacing between decoder engines 340, RAM conflicts can be avoided.

Figure 6:
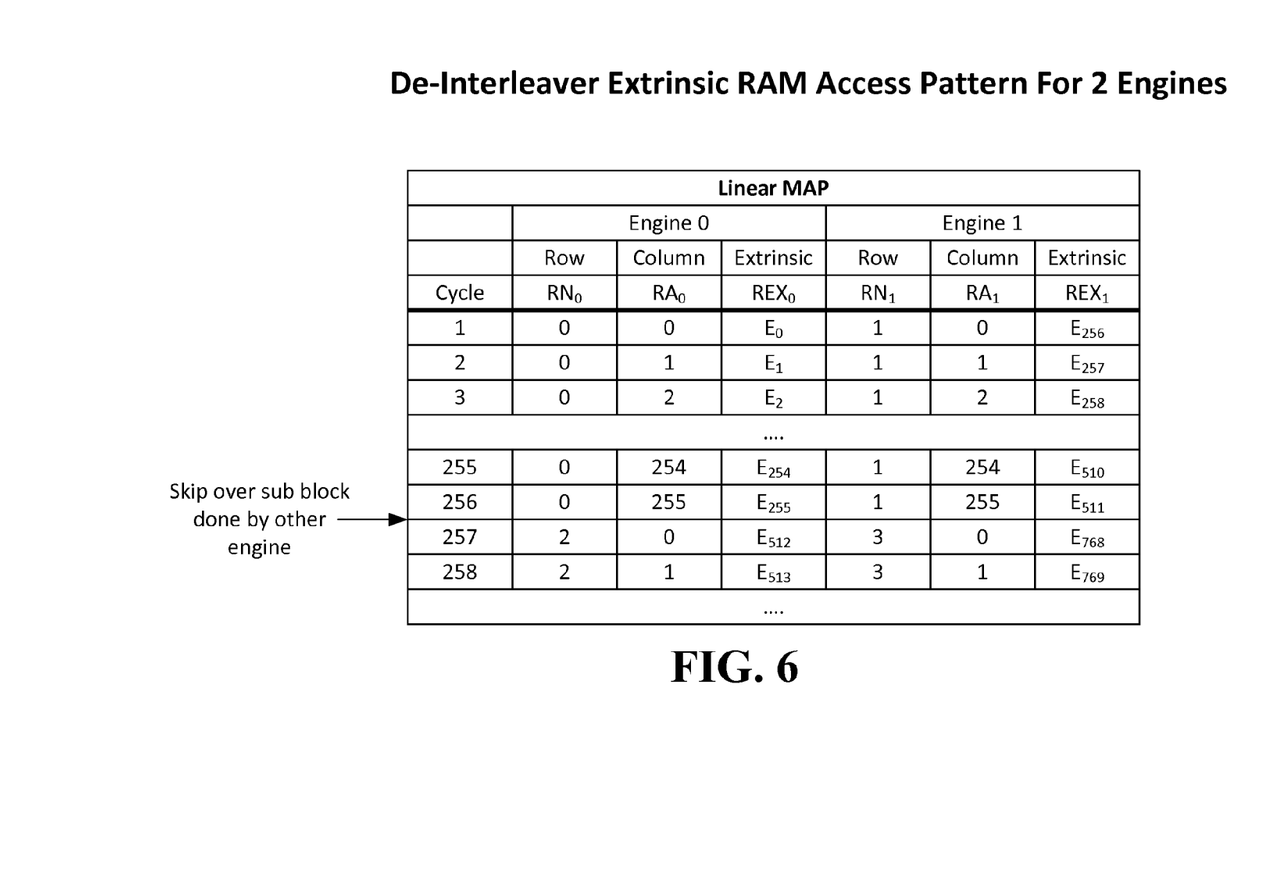
FIG. 6 illustrates the RAM access performed every cycle for a linear MAP.

FIG. 6 illustrates a cycle by cycle operation of the turbo decoder 130 for the example of FIG. 4. The table corresponds to an exemplary turbo decoder configured with two engines during a linear MAP estimate. Each line in the table corresponds to a decoder clock cycle. Values for decoder engine 0 start in row 0, column 0 of the matrices in FIG. 4. For an exemplary cycle 1, the deinterleaver 360 would output $RA_0=0$, and $RN_0=0$. The extrinsic reader 350 outputs $REX_0$ equal to the extrinsic value corresponding to the $0^{th}$ processed data bit 105 or $E_0$. Values for decoder engine 1 start in row 1, column 0 of the matrices in FIG. 4. For exemplary cycle 1, the deinterleaver 360 outputs $RA_1=0$, and $RN_1=1$. The extrinsic reader 350 would output $REX_0$ equal to the extrinsic value corresponding to the $256^{th}$ processed data bit 105 or $E_{256}$. Both decoder engines operate across their respective rows. When the end of the row is reached, both decoder engines advance to the next row that requires processing, skipping any rows processed by other decoder engines. This decoder engine processing order guarantees that both decoder engines will never simultaneously be processing extrinsic values from the same row, and there will be no conflicts.

Figure 7:
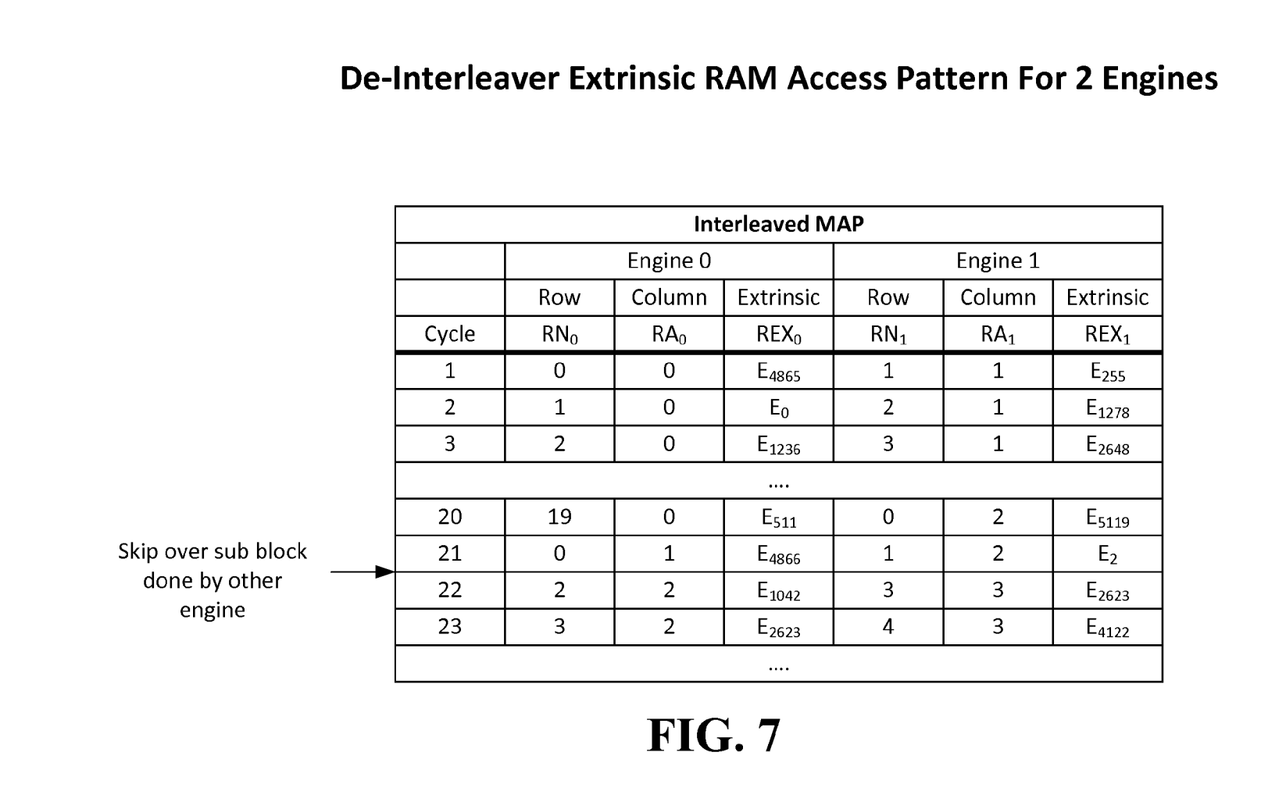
FIG. 7 illustrates the RAM accesses performed every cycle for an interleaved MAP estimates.

FIG. 7 illustrates a cycle by cycle operation of the turbo decoder 130 for the example of FIG. 4. The table corresponds to an exemplary turbo decoder configured with two decoder engines during an interleaved MAP estimate. This is the interleaved MAP version of FIG. 6. Each line in the table corresponds to a decoder clock cycle. Values for decoder engine 0 start in row 0, column 0 of the matrices in FIG. 4. For an exemplary cycle, 1 the deinterleaver 360 outputs $RA_0=0$, and $RN_0=0$. The extrinsic reader 350 would output $REX_{4865}$ equal to the extrinsic value corresponding to the $4865^{th}$ processed data bit 105 or $E_{4865}$. Values for the decoder engine 1 start in row 1, column 1 of the matrices in FIG. 4. For exemplary cycle 1, the deinterleaver 360 would output $RA_1=1$, and $RN_1=1$. The extrinsic reader 350 would output $REX_0$ equal to the extrinsic value corresponding to the $255^{th}$ processed data bit 105 or $E_{255}$. Both decoder engines operate down their respective columns. When the end of the column is reached, the decoder engine advances to row zero of the next column. Once decoder engine 0 processes the extrinsic value just prior to the decoder engine 1 starting extrinsic value, both decoder engines skip over the already processes extrinsic values. This decoder engine processing order guarantees that both decoder engines will never be processing extrinsic values from the same row, and there will be no conflicts.

Figure 8:
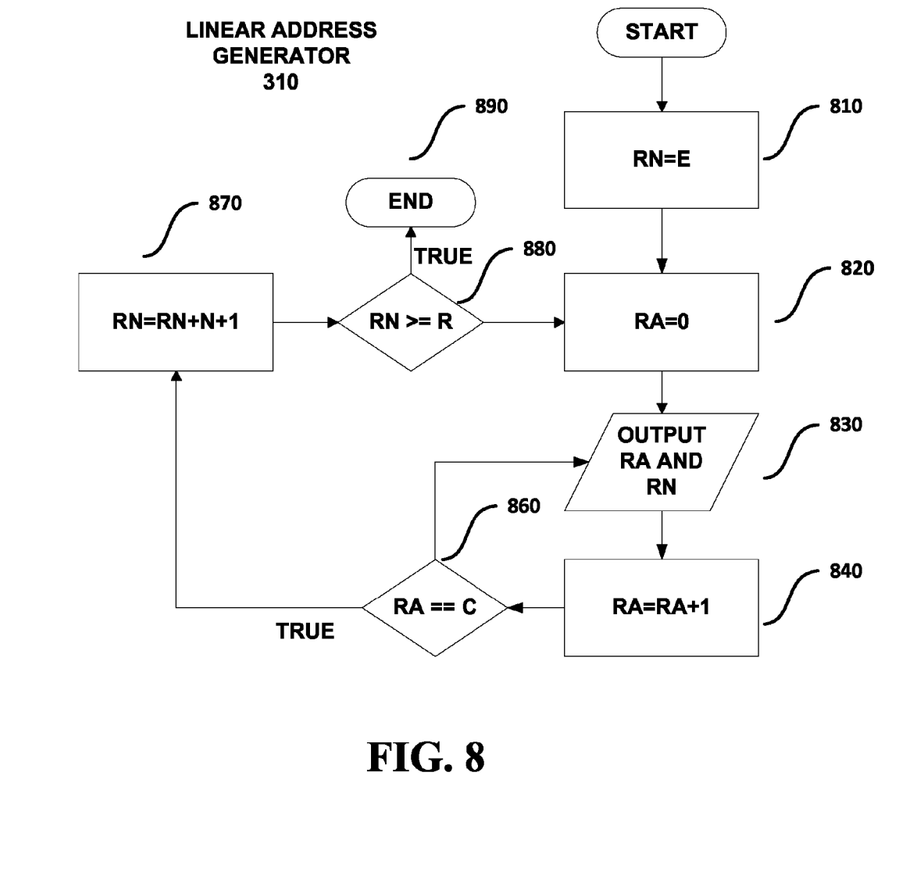
FIG. 8 illustrates a flow diagram of the process performed by the linear address generator according to an exemplary embodiment of the present invention.

FIG. 8 illustrates a flow diagram of a process performed by a linear address generator according to an exemplary embodiment of the present invention. Given the exemplary embodiment of FIG. 3, N+1 linear address generators 310 are disclosed, one for each decoder engine 340, and the linear address generator 310 operates just during even MAP estimates when the extrinsic values are read in linear order. In the process illustrated in FIG. 8, R represents a number of rows in the interleaver matrix 420, C represents the number of columns in the interleaving matrix used by the turbo code internal interleaver 220, RN represents RAM number, RA represents RAM address, and E represents decoder engine number.

An initial step 810 includes setting the RAM Number RN equal to the E, the decoder engine number for this instance of the linear address generator 310. In step 820 the RAM Address RA is set to zero. In step 830 the RAM Address RA and RAM Number RN are output to the extrinsic RAMs 160, for example, through the extrinsic reader 350 and the extrinsic writer 370. In an example, the extrinsic reader 350 and extrinsic writer 370, access RAM address RA from RAM number RN. The RAM Address RA is incremented by 1 in step 840 to move to the next column. The RAM Address RA continues incrementing until the RAM Address RA=C columns in step 860. When the RAM Address RA=C, flow proceeds to step 870. In step 870, the RAM Number RN is incremented by N+1 to skip over all the other instances of the linear address generator 310. This is done until a determination is made that all rows have been processed at step 880, at which time the method may end at step 890. All rows have been processed when RN is greater or equal to R rows. Otherwise, when a determination is made in step 880 that more rows need processing, then flow returns to step 820, at which the RAM Address RA is set to zero.

Figure 9:
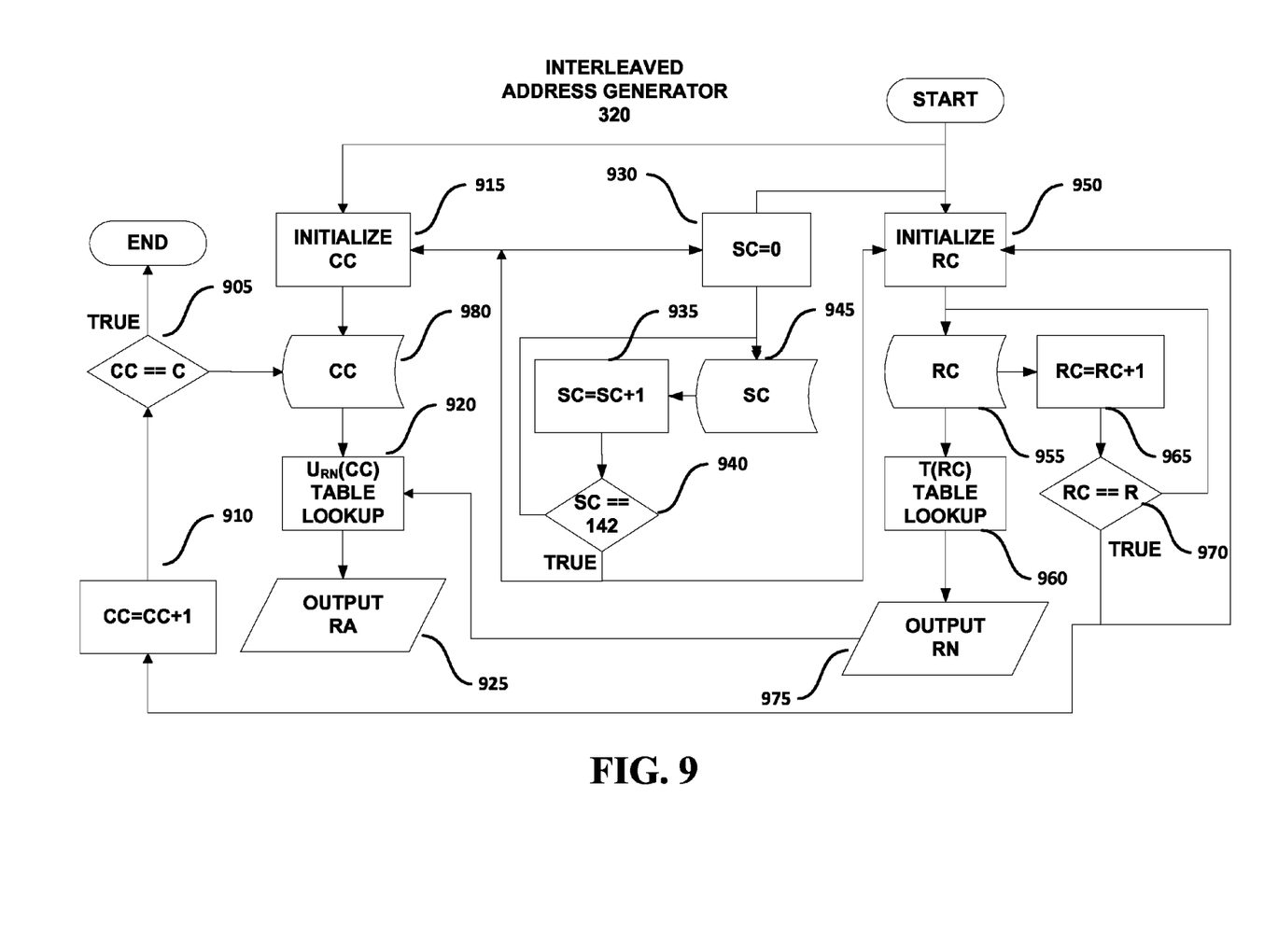
FIG. 9 illustrates a flow diagram of the process performed by the interleaved address generator according to an exemplary embodiment of the present invention.

FIG. 9 illustrates a flow diagram of a process performed by the interleaved address generator 320 according to an exemplary embodiment of the present invention. The process illustrated generates addresses used to accesses the extrinsic RAMs 160 during odd MAP estimates. For odd MAP estimates, the extrinsic values are accessed in interleaved order. There are N+1 interleaved address generators, one for each decoder engine 340. Ui(j) can be used for $U_{RN}(CC)$ in step 920 as the intra-row permutation pattern. T(i) can be used for T(RC) in step 960 and represent, for example, the inter-row permutation pattern defined in Section 25.212 of the 3GPP cellular specifications. In the FIG. 9, R represents a number of rows in the interleaver matrix 420, C represents the number of columns in the interleaving matrix used by the turbo code internal interleaver 220, CC represents column count, SC represents sub-block count, RN represents RAM number, and RA represents RAM address.

At the beginning of a turbo decoder MAP estimate, the row counter CC is initialized in step 915, the sub-block count SC 945 is initialized to zero in step 930, and the row counter is initialized in step 950. Address generation in interleaved mode is performed using the row count RC 955. Every cycle the row count 955 is incremented in step 965. This row count is translated by a T(RC) table lookup in step 960, to generate the RAM number RN in step 975 and output to direct access to the extrinsic RAMs 160 by, for example, the extrinsic reader 350 and the extrinsic writer 370.

When RC equals R as determined in step 970, the column count CC is incremented in step 910 and RC is re-initialized at step 950. The column count CC 980 and RAM number RN are used as $U_{RN}(CC)$ in step 920 to look up the RAM address RA and output RA in step 925 to the extrinsic RAMSs 160 through, for example, the extrinsic reader 350 and the extrinsic writer 370. In an example, the extrinsic reader 350 and extrinsic writer 370, access RAM address RA from RAM number RN. The sub-block count SC 945 is incremented every cycle in step 935, and is used to determine when the sub block ends. When a determination is made that the sub-block count 945 equals the preferred embodiment sub block size of 142 in step 940, it is the end of the sub-block, and the CC, SC and RC counters are initialized to be beginning of the next sub-block in steps 915, 930, and 950 respectively. The MAP estimate operation is complete when a determination is made that the column count CC equals C in step 905. Address generation in interleaved mode is performed using the column count CC 980.

While embodiments of the present invention address the problem of how to generate addresses with no memory conflicts on the extrinsic RAM in a scalable parallel turbo decoder architecture without loss of cycles or extra overhead for specifications such as the 3GPP cellular specifications, the present invention is applicable to other specifications now or in the future.

The interleaver of the turbo encoder can use a matrix representation with C columns and R rows, such as, for example, the interleaver defined in the 3GPP cellular specifications. Data bits to be interleaved are put into the matrix in the first row in column 0, 1, 2 . . . , C−1, then the second row and so on. Then the data bits are taken out of the matrix from the first column, from row 0, 1, 2, . . . R−1, then the second column. The number of rows R can be 5, 10 or 20. The number of columns C can range from 8 to 256.

In order to undo the interleaving in the decoder, the turbo decoder reads the extrinsic values in interleaved order. After the decoder improves the extrinsic values, it then writes the extrinsic values to the same interleaved address. This is equivalent to de-interleaving the extrinsic values, processing them, and re-interleaving them.

Embodiments of the present invention exploit characteristics of an interleaver, such as the interleaver in the 3GPP cellular specifications, to create an address generation algorithm that guarantees no extrinsic memory conflicts. In contrast, the interleaver in the 3GPP cellular specifications may allow memory conflicts to occur. According to an embodiment, each turbo block is broken into sub blocks of a predetermined size (L). A sub block size is chosen that allows each decoder engine to work on one row of the interleaver matrix without causing memory conflicts.

A radix-2 turbo decoder processes 1 extrinsic value per decoder engine per cycle. A radix-4 turbo decoder processes 2 extrinsic value per decoder engine per cycle. Multiple accesses to the same extrinsic RAM in the same cycle are guaranteed not to occur for radix-4 and radix-2 turbo decoders. Twenty dual port RAMs can be used to store the extrinsic values, one RAM for each interleaver row. This can scale to 20 radix-2 decoder engines or 10 radix-4 decoder engines. The turbo decoder can scale to beyond that in systems where there are more than twenty rows.

By way of example, consider the interleaving matrix shown in FIG. 4. Define $E_k$ to be the $k^{th}$ extrinsic value. The values shown in the matrices in FIG. 4 are the indexes k of the extrinsic values $E_k$. The sub block size is 256, and there are 2 decoder engines. For a radix-2 decoder doing an even MAP estimate, the turbo decoder will read/write the extrinsic values according to the table in FIG. 6. Values corresponding to each decoder engine are in a row associated with the decoder engine. For linear MAP estimates, the indexes fill a row first, so index 256 is in the second row. Since each extrinsic row has its own RAM, there are no conflicts.

For the same decoder doing an odd MAP estimate, assume the sub block size would be 21 (this is not practical, and is only used for illustration). The decoder will read/write the extrinsic values according to the table in FIG. 7. Values corresponding to each decoder engine are still a row associated with the decoder engine. For interleaved MAP estimates, the indexes fill the column first, so index 21 wraps around to row 1 column 1. Values corresponding to decoder engine 1 will always be one column ahead of values corresponding to decoder engine 0.

The approach used in the embodiments of the present invention takes advantage of the fact that the interleaver of the encoder re-orders the rows, and randomly re-orders the data within a row, but does not move data from one row to another. For even MAP estimates the sub block size is a multiple of C. For odd MAP estimates the preferred sub block size is 142. These sizes are chosen to allow each decoder engine to work on one row of the interleaver matrix without causing memory conflicts. For K<=142, only one decoder engine will be used and the sub block size is irrelevant. If the interleaving matrix contains dummy bits, such as, for example, the dummy bits defined in 3GPP cellular specification 25.212 Section 4.2.3.2.3.1, the decoder engine is idle for the cycle where an out of bounds address to this dummy bit or dummy entry is encountered. If the decoder engine is not idle, and skips over this dummy bit or dummy entry, it will jump ahead to the next interleaving row, and will eventually have conflicts with other decoder engines.

According to a further alternative embodiment, an address generator skips read of extrinsic values corresponding to dummy entries in the interleaving matrix. The linear address generator 310 and the interleaved address generator 320 in the embodiment of FIG. 3 save time and reduces conflicts with write operations by knowing where the dummy entries are located and thus skip read steps for the extrinsic values corresponding to the locations for the dummy entries in the interleaving matrix. The address generators 310 and 320 in embodiments can still group the extrinsic values addressed for storage in the extrinsic addressable memories such that all the extrinsic values in each one of the rows go in a same one of the plurality of the extrinsic addressable memories. Also the address generators 310 and 320 in embodiments can still use a counter that skips read of extrinsic values corresponding to dummy entry addresses by continuing to count over the dummy entries in the interleaving matrix.

According to various embodiments, memory conflicts are avoided by allowing each row to be accessed by only one decoder engine. The algorithm also allows the deinterleaver to be designed in a way to guarantee that multiple accesses to the same extrinsic RAM do not occur at the same address in a radix-4 turbo decoder. This is accomplished by assuring each decoder engine has 2 unique rows. Finally, embodiments of the innovation may allow the turbo decoder to operate without any loss of cycles or extra overhead.

The turbo decoder in the embodiments of the present invention can be used by any methods or apparatus that use a 3GPP interleaver in the turbo encoding process such as Group System for Mobile communications (GSM), Universal Mobile Telecommunications System (UMTS) or High-Speed Downlink Packet Access (HSDPA).

An embodiment of a turbo decoder includes a plurality of turbo decoder engines, a plurality of extrinsic addressable memories, an extrinsic reader, an extrinsic writer, and a deinterleaver. The plurality of turbo decoder engines are for concurrently decoding a received signal encoded within rows and columns of an interleaving matrix where interleaved values stayed in a same re-ordered row during interleaving. The plurality of extrinsic addressable memories are operatively coupled to the turbo decoder engines and are to store extrinsic values used by the turbo decoder engines. The extrinsic reader is operatively coupled between the extrinsic addressable memories and the turbo decoder engines and is to access the extrinsic addressable memories using extrinsic addresses for accessing the extrinsic addressable memories. The extrinsic writer is operatively coupled between the extrinsic addressable memories and the turbo decoder engines to access the extrinsic addressable memories using the extrinsic addresses for accessing the extrinsic addressable memories. The deinterleaver is operatively coupled to the extrinsic reader and is to access the extrinsic addressable memories by arranging storage of the extrinsic values by the same rows of the same interleaving matrix that were used to encode the received signal, each of the rows corresponding to one of the plurality of turbo decoder engines.

According to a further embodiment, the deinterleaver groups the extrinsic values addressed for storage in the extrinsic addressable memories such that all the extrinsic values in each one of the rows of the interleaving matrix go in a same one of the plurality of the extrinsic addressable memories.

According to a further embodiment, the deinterleaver generates the extrinsic addresses for addressing the extrinsic addressable memories to access the extrinsic addressable memories and obtain the extrinsic values therefrom in the same rows of the same interleaving matrix that was used to encode the received signal.

According to a further embodiment, the deinterleaver includes a linear address generator operatively coupled to extrinsic reader to generate the extrinsic addresses to read extrinsic values corresponding to one of the rows of the interleaving matrix at a time.

According to a further embodiment, the linear address generator includes a counter to generate the extrinsic addresses to read extrinsic values corresponding to one of the rows of the interleaving matrix at a time.

According to a further embodiment, the deinterleaver includes an interleaved address generator operatively coupled to extrinsic reader to generate the extrinsic addresses to read extrinsic values corresponding to one of the columns of the interleaving matrix at a time.

According to a further embodiment, the interleaved address generator includes a counter and a translation table location identified by the counter to generate the extrinsic addresses to read extrinsic values corresponding to one of the columns of the interleaving matrix at a time.

According to a further embodiment, the deinterleaver skips read of extrinsic values corresponding to dummy entries in the interleaving matrix.

According to a further embodiment, the counter skips read of extrinsic values corresponding to dummy entry addresses by continuing to count over the dummy entries in the interleaving matrix.

According to a further embodiment, the turbo decoder breaks the received signal into sub blocks of a size that allows each row of the interleaver matrix to correspond to one of the plurality of turbo decoder engines.

According to a further embodiment, the each one of the plurality of the extrinsic addressable memories includes a RAM.

An embodiment of a method of turbo decodes a received signal encoded within rows and columns of an interleaving matrix where interleaved values stayed in a same re-ordered row during interleaving. Parallel turbo decoding operations are concurrently performed on the received signal. Extrinsic values are stored in extrinsic addressable memories used by the turbo decoding. The extrinsic addressable memories are read accessed using extrinsic addresses for accessing them. The extrinsic addressable memories are write accessed using the extrinsic addresses for accessing them. Deinterleaving is performed to access the extrinsic addressable memories by arranging storage of the extrinsic values by the same rows of the same interleaving matrix that was used to encode the received signal. Each of the rows accessed correspond to one of the concurrent turbo decoding operations.

According to a further embodiment, the deinterleaving groups the extrinsic values addressed for storage in the extrinsic addressable memories such that all the extrinsic values in each one of the rows of the interleaving matrix go in a same one of the plurality of the extrinsic addressable memories.

According to a further embodiment, the deinterleaving generates the extrinsic addresses for addressing the extrinsic addressable memories to access the extrinsic addressable memories and obtain the extrinsic values therefrom in the same rows of the same interleaving matrix that was used to encode the received signal.

According to a further embodiment, the deinterleaving linearly generates the extrinsic addresses to read extrinsic values corresponding to one of the rows of the interleaving matrix at a time.

According to a further embodiment, counting generates the extrinsic addresses to read extrinsic values corresponding to one of the rows of the interleaving matrix at a time.

According to a further embodiment, the deinterleaving interleaves the extrinsic addresses to read extrinsic values corresponding to one of the columns of the interleaving matrix at a time.

According to a further embodiment, counting and identifying a location in a translation table identified by the counting generates the extrinsic addresses to read extrinsic values corresponding to one of the columns of the interleaving matrix at a time.

According to a further embodiment, the deinterleaving skips read of extrinsic values corresponding to dummy entries in the interleaving matrix.

According to a further embodiment, the counting skips read of extrinsic values corresponding to dummy entry addresses by continuing to count over the dummy entries in the interleaving matrix.

According to a further embodiment, the concurrently performed parallel turbo decoding operations on the received signal breaks the received signal into sub blocks of a size that allows each row of the interleaver matrix to correspond to one of the plurality of turbo decoding operations.

An embodiment of an encoding and decoding system includes a turbo encoder and a turbo decoder. The turbo encoder encodes an input sequence of values to generate an encoded signal, the turbo encoder includes an interleaver that uses a predetermined interleaving sequence to interleave the values of the input sequence within rows and columns of an interleaving matrix with the values of each row form a group, wherein the values in each group stay within a same group. The turbo decoder includes a plurality of turbo decoder engines, a plurality of extrinsic addressable memories, an extrinsic reader, an extrinsic writer, and a deinterleaver. The plurality of turbo decoder engines are for concurrently decoding a received signal encoded within rows and columns of an interleaving matrix where interleaved values stayed in a same re-ordered row during interleaving. The plurality of extrinsic addressable memories are operatively coupled to the turbo decoder engines and are to store extrinsic values used by the turbo decoder engines. The extrinsic reader is operatively coupled between the extrinsic addressable memories and the turbo decoder engines and is to access the extrinsic addressable memories using extrinsic addresses for accessing the extrinsic addressable memories. The extrinsic writer is operatively coupled between the extrinsic addressable memories and the turbo decoder engines to access the extrinsic addressable memories using the extrinsic addresses for accessing the extrinsic addressable memories. The deinterleaver is operatively coupled to the extrinsic reader and to generate the extrinsic addresses for accessing the extrinsic addressable memories by arranging storage of the extrinsic values in a way that avoids extrinsic memory conflicts such that each of the turbo decoder engines uses extrinsic values corresponding to one of the rows of the interleaving matrix that was used to encode the encoded signal.

According to a further embodiment, the interleaver re-orders the groups among rows and re-orders the values within a group.

An embodiment of a turbo decoder includes a plurality of turbo decoder engines, a plurality of extrinsic addressable memories, an extrinsic reader, an extrinsic writer, and an address generator. The plurality of turbo decoder engines are for concurrently decoding a received signal encoded within rows and columns of an interleaving matrix where interleaved values stayed in a same re-ordered row during interleaving. The plurality of extrinsic addressable memories are operatively coupled to the turbo decoder engines and are to store extrinsic values used by the turbo decoder engines. The extrinsic reader is operatively coupled between the extrinsic addressable memories and the turbo decoder engines and is to access the extrinsic addressable memories using extrinsic addresses for accessing the extrinsic addressable memories. The extrinsic writer is operatively coupled between the extrinsic addressable memories and the turbo decoder engines to access the extrinsic addressable memories using the extrinsic addresses for accessing the extrinsic addressable memories. The address generator is operatively coupled to the extrinsic reader and is to access the extrinsic addressable memories by the same rows of the same interleaving matrix that were used to encode the received signal and skip read of extrinsic values corresponding to dummy entries in the interleaving matrix.

According to a further embodiment, the address generator comprises a counter that skips read of extrinsic values corresponding to dummy entry addresses by continuing to count over the dummy entries in the interleaving matrix.

According to a further embodiment, each of the rows correspond to one of the plurality of turbo decoder engines.

According to a further embodiment, the address generator groups the extrinsic values addressed for storage in the extrinsic addressable memories such that all the extrinsic values in each one of the rows go in a same one of the plurality of the extrinsic addressable memories.

The signal processing techniques disclosed herein with reference to the accompanying drawings can be implemented on one or more digital signal processors (DSPs) or other microprocessors. Nevertheless, such techniques could instead be implemented wholly or partially as hardwired circuits. The RAM could refer to a physical RAM instance in silicon, or a buffer in a DSP. Further, it is appreciated by those of skill in the art that certain well known digital processing techniques are mathematically equivalent to one another and can be represented in different ways depending on choice of implementation.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. They can have different configurations than the examples illustrated in the drawings. Any benefits, advantages, or solutions to problems that are described herein with regard to specific embodiments are not intended to be construed as a critical, required, or essential feature or element of any or all the claims.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A turbo decoder comprising:
   a plurality of turbo decoder engines configured to concurrently decode a received signal encoded within rows and columns of an interleaving matrix where interleaved values stayed in a same re-ordered row during interleaving;
a plurality of extrinsic addressable memories operatively coupled to the turbo decoder engines and configured to store extrinsic values used by the turbo decoder engines for the decoding;
an extrinsic reader operatively coupled between the extrinsic addressable memories and the turbo decoder engines and configured to read from the extrinsic addressable memories using extrinsic addresses for accessing the extrinsic addressable memories; and
an extrinsic writer operatively coupled between the extrinsic addressable memories and the turbo decoder engines and configured to write to the extrinsic addressable memories using the extrinsic addresses for accessing the extrinsic addressable memories; and
a deinterleaver operatively coupled to the extrinsic reader and configured to access the extrinsic addressable memories by arranging storage of the extrinsic values by the same rows of the same interleaving matrix, which same rows were previously used to encode the received signal, and each of the same rows corresponds to one turbo decoder engine of the plurality of turbo decoder engines.

2. A turbo decoder according to claim 1, wherein the deinterleaver is configured to group the extrinsic values addressed for storage in the extrinsic addressable memories such that all the extrinsic values in each one of the rows of the interleaving matrix go in a same one of the plurality of the extrinsic addressable memories.

3. A turbo decoder according to claim 1, wherein the deinterleaver is configured to generate the extrinsic addresses for addressing the extrinsic addressable memories and is configured to access the extrinsic addressable memories and obtain the extrinsic values therefrom in the same rows of the same interleaving matrix that was used to encode the received signal.

4. A turbo decoder according to claim 3, wherein the deinterleaver comprises a linear address generator operatively coupled to the extrinsic reader and is configured to generate the extrinsic addresses to read extrinsic values corresponding to one of the rows of the interleaving matrix at a time.

5. A turbo decoder according to claim 4, wherein the linear address generator comprises a counter configured to generate the extrinsic addresses to read extrinsic values, the extrinsic values corresponding to one of the rows of the interleaving matrix at a time.

6. A turbo decoder according to claim 4, wherein the deinterleaver comprises an interleaved address generator operatively coupled to the extrinsic reader and configured to generate the extrinsic addresses to read extrinsic values corresponding to one of the columns of the interleaving matrix at a time.

7. A turbo decoder according to claim 6, wherein the interleaved address generator comprises a counter and a translation table, wherein the interleaved address generator is configured for the counter to identify a location in the translation table and generate the extrinsic addresses to read extrinsic values corresponding to one of the columns of the interleaving matrix at a time.

8. A turbo decoder according to claim 7,
wherein the deinterleaver is configured to skip read of extrinsic values corresponding to dummy entries in the interleaving matrix; and
wherein the counter is configured to skip read of extrinsic values corresponding to dummy entry addresses by being further configured to continue to count over the dummy entries in the interleaving matrix.

9. A turbo decoder according to claim 1, wherein the turbo decoder is configured to break the received signal into sub blocks of a size that allows each row of the interleaver matrix to correspond to one of the plurality of turbo decoder engines.

10. A method of turbo decoding, the method comprising:
(a) concurrently performing parallel turbo decoding operations on a received signal, wherein the received signal was encoded within rows and columns of an interleaving matrix where interleaved values stayed in a same re-ordered row during interleaving;
(b) storing extrinsic values in extrinsic addressable memories used by the turbo decoding of said step (a);
(c) read accessing the extrinsic addressable memories using extrinsic addresses for accessing the extrinsic addressable memories;
(d) write accessing the extrinsic addressable memories using the extrinsic addresses for accessing the extrinsic addressable memories; and
(e) deinterleaving to access the extrinsic addressable memories by arranging storage of the extrinsic values by the same rows of the same interleaving matrix that was used to encode the received signal, each of the rows corresponding to one of the concurrent turbo decoding operations of said step (a).

11. A turbo decoder according to claim 10, wherein said step (e) of deinterleaving groups the extrinsic values addressed for storage in the extrinsic addressable memories such that all the extrinsic values in each one of the rows of the interleaving matrix go in a same one of the plurality of the extrinsic addressable memories.

12. A method of turbo decoding according to claim 10, wherein said step (e) of deinterleaving generates the extrinsic addresses for addressing the extrinsic addressable memories to access the extrinsic addressable memories and obtain the extrinsic values therefrom in the same rows of the same interleaving matrix that was used to encode the received signal.

13. A method of turbo decoding according to claim 12, wherein said step (e) of deinterleaving comprises the sub step of (e)(1) linearly generating the extrinsic addresses to read extrinsic values corresponding to one of the rows of the interleaving matrix at a time; and
wherein the substep of (e)(1) comprises a substep of (e)(1)(i) counting to generate the extrinsic addresses to read extrinsic values corresponding to one of the rows of the interleaving matrix at a time.

14. A method of turbo decoding according to claim 12, wherein said step (e) of deinterleaving comprises the sub steps of:
(e)(1) linearly generating the extrinsic addresses to read extrinsic values corresponding to one of the rows of the interleaving matrix at a time; and
(e)(2) interleaving the extrinsic addresses to read extrinsic values corresponding to one of the columns of the interleaving matrix at a time.

15. A method of turbo decoding according to claim 10, wherein said step (e) of deinterleaving comprises the sub step of (e)(1) skipping read of extrinsic values corresponding to dummy entries in the interleaving matrix by continuing to count over the dummy entries in the interleaving matrix.

16. A method of turbo decoding according to claim 10, wherein said step (a) of concurrently performing parallel turbo decoding operations on the received signal breaks the received signal into sub blocks of a size that allows each row of the interleaver matrix to correspond to one of the plurality of turbo decoding operations.

17. A turbo decoder comprising:
a plurality of turbo decoder engines configured to concurrently decode a received signal encoded within rows and columns of an interleaving matrix where interleaved values stayed in a same re-ordered row during interleaving;
a plurality of extrinsic addressable memories operatively coupled to the turbo decoder engines and configured to store extrinsic values used by the turbo decoder engines for the decoding;
an extrinsic reader operatively coupled between the extrinsic addressable memories and the turbo decoder engines and configured to read from the extrinsic addressable memories using extrinsic addresses for accessing the extrinsic addressable memories; and
an address generator operatively coupled to the extrinsic reader and configured to access the extrinsic addressable memories by the same rows of the same interleaving matrix, which same rows were previously used to encode the received signal, and wherein the address generator is additionally configured to skip read of extrinsic values corresponding to dummy entries in the interleaving matrix.

18. A turbo decoder according to claim 17, wherein the address generator comprises a counter that skips read of extrinsic values corresponding to dummy entry addresses by continuing to count over the dummy entries in the interleaving matrix.

19. A turbo decoder according to claim 17, wherein each of the rows corresponds to one of the plurality of turbo decoder engines.

20. A turbo decoder according to claim 17, wherein the address generator groups the extrinsic values addressed for storage in the extrinsic addressable memories such that all the extrinsic values in each one of the rows go in a same one of the plurality of the extrinsic addressable memories.

* * * * *